(12) United States Patent
Liu

(10) Patent No.: US 12,429,896 B2
(45) Date of Patent: Sep. 30, 2025

(54) CNC SWITCH DEVICE AND CONTROL METHOD

(71) Applicant: Fly Cat Electrical Co., Ltd., Shenzhen (CN)

(72) Inventor: Xiao Liu, Shenzhen (CN)

(73) Assignee: FLY CAT ELECTRICAL CO., LTD., Shenzhen (CN)

(*) Notice: Subject to any disclaimer, the term of this patent is extended or adjusted under 35 U.S.C. 154(b) by 0 days.

(21) Appl. No.: 18/607,864

(22) Filed: Mar. 18, 2024

(65) Prior Publication Data

US 2025/0231574 A1 Jul. 17, 2025

(30) Foreign Application Priority Data

Jan. 16, 2024 (CN) .......................... 202410057689.5

(51) Int. Cl.
*G05G 1/10* (2006.01)
*G05G 9/047* (2006.01)
*H05K 1/18* (2006.01)

(52) U.S. Cl.
CPC .............. *G05G 1/10* (2013.01); *G05G 9/047* (2013.01); *H05K 1/181* (2013.01); *H05K 2201/10151* (2013.01)

(58) Field of Classification Search
CPC .......... G05G 1/10; G05G 9/047; H05K 1/181; H05K 2201/10151
See application file for complete search history.

(56) References Cited

U.S. PATENT DOCUMENTS

| 12,004,299 | B1* | 6/2024 | Heikkinen | ............... B29C 51/14 |
| 2012/0287032 | A1* | 11/2012 | Olssen | .................. G06F 3/0338 345/156 |
| 2023/0168753 | A1* | 6/2023 | Hartman | .................. G05G 1/02 345/184 |
| 2024/0062970 | A1* | 2/2024 | Hammer | .................. H01H 3/26 |

FOREIGN PATENT DOCUMENTS

CN 220984408 U * 5/2024
WO WO-2023157737 A1 * 8/2023

OTHER PUBLICATIONS

Translation of WO 2023157737 A1. Saito et al., Aug. 24, 2023 (Year: 2023).*
Translation of CN-220984408-U, Liu, May 17, 2024 (Year: 2024).*

* cited by examiner

*Primary Examiner* — James A Shriver, II
(74) *Attorney, Agent, or Firm* — GREENBLUM & BERNSTEIN, P.L.C.

(57) ABSTRACT

A CNC switch device is provided, including a knob mechanism and a PCB. The knob mechanism is provided with a magnet, and the PCB is provided with an induction component and a control component. When the knob mechanism rotates with respect to the PCB in a contactless mode, the magnet is configured to rotate with the knob mechanism. The induction component on the PCB is configured to sense position information of the magnet and transmit the sensed position information to the control component. The control component is configured to regulate a switch gear of the CNC switch based on the position information.

10 Claims, 4 Drawing Sheets

CNC SWITCH DEVICE AND CONTROL METHOD

CROSS-REFERENCE TO RELATED APPLICATION

This application claims priority to Chinese Patent Application No. 202410057689.5, filed with the China National Intellectual Property Administration and entitled "Computer Numerical Control Switch Device and Control Method" on Jan. 16, 2024, which is incorporated herein by reference in its entirety.

TECHNICAL FIELD

The present disclosure relates to the field of switch control technology, and particularly to a Computer Numerical Control (CNC) switch device and a control method.

BACKGROUND

Gear switches are a common type of switch in daily life, and such a switch is operated by rotating a knob to achieve different operating states.

Currently, the gear switch on the market implements gear switching by means of elastic deformation of a metal elastic sheet. When an operation force is applied to the switch, the metal elastic sheet is bent or elastically deformed to cause connection or disconnection of a contact inside the switch, thereby implementing the switching among different gears.

However, when such a switch is used, the metal elastic sheet is subject to contact wear, and accordingly, the service life of the switch is short.

SUMMARY

In view of this, as for the above technical problem, it is necessary to provide a CNC switch device and control method capable of reducing the contact wear of the switch.

In the first aspect of the present disclosure, a Computer Numerical Control (CNC) switch device is provided, including a knob mechanism and a Printed Circuit Board (PCB); the knob mechanism is provided with a magnet, and the PCB is provided with an induction component and a control component; when the knob mechanism is configured to rotate with respect to the PCB in a contactless mode, the magnet is configured to rotate with the knob mechanism, the induction component on the PCB is configured to sense position information of the magnet and transmit the sensed position information to the control component, and the control component is configured to regulate a switch gear of the CNC switch based on the position information.

In an embodiment, the induction component comprises a plurality of Hall components, and the control component comprises a single-chip microcomputer, wherein the plurality of Hall components are arranged on the PCB in a dispersion mode and each configured to generate induction information and transmit the induction information to the single-chip microcomputer when the magnet enters an induction range of the Hall component.

In an embodiment, the single-chip microcomputer is further configured to receive the induction information transmitted by the Hall component, determine position information of the magnet according to a transmission pin of the induction information and position information of the Hall component, and determine a rotation position of the knob mechanism, to generate switch gear information corresponding to the rotation position of the knob mechanism.

In an embodiment, the CNC switch device may further include a display component, wherein the display component is configured to display current switch gear information.

In an embodiment, the display component comprises an LED component, and the LED component is configured to display a digital gear.

In an embodiment, the CNC switch device may further include a voltage regulation circuit, the control component is configured to generate, based on the induction information, a voltage regulation signal corresponding to the rotation position of the knob mechanism, and output the voltage regulation signal to the voltage regulation circuit; and the voltage regulation circuit is configured to regulate an output voltage according to the voltage regulation signal, to regulate the switch gear of the CNC switch.

In an embodiment, a first pin of each Hall component is configured to be connected to a power supply, a second pin of each Hall component is configured to be connected to the single-chip microcomputer through a resistor, and a third pin of each Hall component is configured to be grounded.

In an embodiment, there exists ten Hall components, the second pin of each Hall component is configured to be electrically connected to a preset pin on the single-chip microcomputer, and the first pin of each Hall component is configured to be connected to the same power supply.

In an embodiment, distribution positions of the Hall components on the PCB match a rotation trajectory of the magnet.

In an embodiment, a Hall component is a Hall effect sensor integrated circuit (IC) configured to detect a magnetic field based on a Hall effect.

In an embodiment, the LED component is configured to remain continuously illuminated when the control component receives the induction information, to indicate that the knob mechanism is currently in one gear.

In an embodiment, the single-chip microcomputer is configured to receive the induction information of each Hall component, and obtain a rotation trajectory and a rotation direction of the knob mechanism according to a time stamp of each received induction information.

In an embodiment, the switch gear of the CNC switch is regulated when a duration in which the single-chip microcomputer acquires the currently received induction information is greater than a preset duration threshold.

In the second aspect of the present disclosure, a CNC switch control method is provided, which may be applied to the control component in the CNC switch device, and the method may include: acquiring induction information transmitted by the induction component, in which the induction information is generated by the induction component in response to a rotation of the knob mechanism; and regulating a switch gear of the CNC switch based on the induction information.

In the above-mentioned CNC switch device and control method, the knob mechanism is provided with the magnet, and the PCB is provided with the induction component and the control component; when the knob mechanism is configured to rotate with respect to the PCB in the contactless mode, the magnet is configured to rotate with the knob mechanism, the induction component on the PCB is configured to sense the position information of the magnet and transmit the sensed position information to the control component, the control component is configured to regulate the switch gear of the CNC switch based on the position information. The rotation position information of the knob mechanism is detected and converted by the induction component and the control component, to regulate the CNC switch to the switch gear corresponding to the rotation position. The knob mechanism rotates with respect to PCB in the contactless mode. Accordingly, compared to the conventional contact switch, the CNC switch device provided in the embodiment has no contact metal elastic sheet, so that no contact wear in the use process, and the service life is long. In addition, since only the knob mechanism serves as a movable component in the CNC switch device, the whole device has better waterproofness and higher reliability, and can be embedded in various household electrical appliances, and thus has a wider applicability.

BRIEF DESCRIPTION OF THE DRAWINGS

In order to describe the technical solution in the embodiments of the present disclosure or the related technologies more clearly, the accompanying drawings required for describing the embodiments or the related technologies will be briefly introduced below. Obviously, the accompanying drawings in the following description show merely some embodiments of the present disclosure, and a person of ordinary skill in the art may also obtain other drawings from these accompanying drawings without any creative efforts.

DETAILED DESCRIPTION OF THE EMBODIMENTS

In order to make the purposes, features, and advantages of the present disclosure clearer, the present disclosure will be elaborated below with reference to the accompanying drawings and embodiments. Many specific details are described below to facilitate full understanding of the present disclosure. However, the present disclosure may be implemented in many different modes from those described herein. A person skilled in the art may perform similar improvements without departing from the concept of the present disclosure. Therefore, the present disclosure is not limited to the specific embodiments disclosed below.

In the description of the present disclosure, it should be understood that the azimuth or position relationship indicated by the term "above" is based on the azimuth or position relationship shown in the accompanying drawings, and is merely for ease of description and simplification of the present disclosure, and is not intended to indicate or imply that the device or component referred to definitely has a specific azimuth, or is constructed and operated in a specific azimuth, thereby such term cannot be understood as a limitation of the present disclosure. In addition, the terms "first", "second", and the like, which are used for the purpose of description only, are not to be understood to indicate or imply relative importance or implicitly indicate the number of indicated technical features. Therefore, a feature defined with "first" or "second" may explicitly or implicitly include at least one feature. In the description of the present disclosure, the term "multiple" means at least two, for example, two or three, unless otherwise specifically limited.

It should be noted that, if a component is referred to as being "provided" on another component, the component may be directly on another component or there may exist an intermediate component. When a component is referred to as be "connected" to another component, the component may be connected directly to another component, or through an intermediate component. In addition, the "connection" in the following embodiments should be understood as "electrical connection", "communication connection", and the like when there exists an electrical signal or a data transmission between connected objects. A person of ordinary skill in the art may understand the specific meanings of the above-mentioned terms in the present disclosure according to specific conditions.

Figure 1:
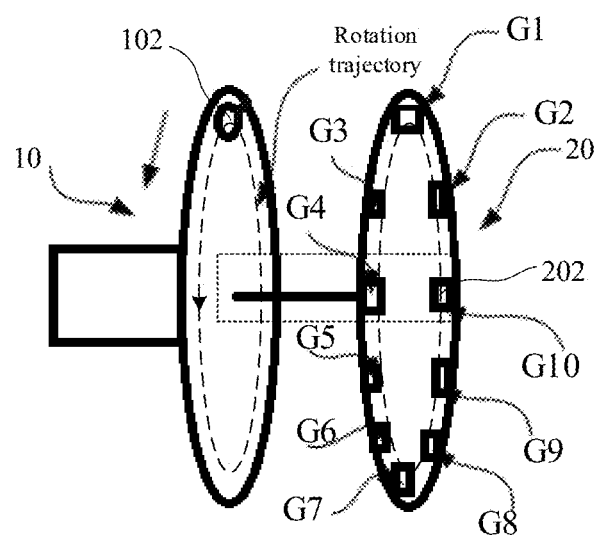
FIG. 1 is a schematic structure diagram of a CNC switch device according to an embodiment.

Referring to FIG. 1, FIG. 1 shows a schematic structure diagram of a Computer Numerical Control (CNC) switch device according to an embodiment of the present disclosure. The CNC switch device provided in the embodiment of the present disclosure may include a knob mechanism 10 and a Printed Circuit Board (PCB) 20.

The knob mechanism 10 is provided with a magnet 102, and the PCB 20 is provided with an induction component and a control component. When the knob mechanism 10 rotates with respect to the PCB 20 in a contactless mode, the magnet 102 rotates with the knob mechanism 10. The induction component on the PCB 20 is configured to sense position information of the magnet 102, and transmit the sensed position information to the control component. The control component regulates a switch gear (indicated by G1/G2/G3/G4/G5/G6/G7/G8/G9/G10 shown in FIG. 1) of the CNC switch based on the position information.

The knob mechanism 10 may be rotatably connected to the PCB 20, or may be rotatably connected to another structure configured to fix the PCB 20 in actual applications, instead of being directly connected to the PCB 20. The induction component and the control component on the PCB 20 may be arranged according to actual conditions, and positions of the induction component and the control component are not limited in the embodiment. The induction component may be a device or a sensor configured to detect, measure, or sense a physical quantity or an environmental condition. In the embodiment, the induction component configured to sense the magnet 102 may be a magnetic induction component, such as a magnetoresistor component, a magnetometer, a magnetic encoder, or a Hall effect sensor integrated circuit, etc. The control component may be a control device or member configured to control an operation, a parameter, or a state of the CNC switch device, such as a microcontroller unit, a programmable logic controller, or a single-chip microcomputer 203, etc.

Specifically, when the knob mechanism 10 rotates with respect to the PCB 20 in the contactless mode, the magnet 102 rotates with the knob mechanism 10. During the rotation in a direction indicated by an arrow shown in FIG. 1, a magnetic field intensity of the magnet 102 received at different positions on the PCB 20 varies with the rotation of the magnet 102, and the magnitude of the magnetic field intensity of the magnet 102 is sensed by the induction component on the PCB 20, so that position information of the magnet 102 is sensed. Subsequently, the induction component transmits the position information to the control component, and the control component adjusts the switch gear of the CNC switch based on the position information.

In the above-mentioned CNC switch device, the knob mechanism rotates with respect to the PCB 20 in the contactless mode. Accordingly, compared to the conventional contact switch, the CNC switch device provided in the embodiment does need a contact metal elastic sheet, so that there will be no contact wear during use, and the service life is long. In addition, since only the knob mechanism serves as a movable component in the CNC switch device, the whole device has better waterproofness and higher reliability, and can be embedded in various household electrical appliances, bringing a wider applicability.

In an embodiment, with reference to FIG. 1, the induction component may include a plurality of Hall components 202. The control component may include a single-chip microcomputer 203. The plurality of Hall components 202 are arranged on the PCB 20 in a dispersion mode. The Hall component 202 is configured to generate induction information and transmit the induction information to the single-chip microcomputer 203 when the magnet 102 enters an induction range of the Hall component 202 (marked by the dotted lines shown in FIG. 1).

The Hall component 202 may be a Hall Integrated Circuit (IC). The Hall IC is a Hall effect sensor integrated circuit configured to detect a magnetic field based on the Hall effect. The Hall effect is a phenomenon in which a voltage difference occurs in a direction perpendicular to a current when charge carriers in a conductor or a semiconductor material are subject to an external magnetic field. Using this principle, the Hall IC integrates the Hall component and a signal processing circuit, in order to measure the intensity, direction, and change of the magnetic field.

Specifically, the induction range of the Hall component 202 may be determined through actual magnetic field intensity tests. For example, magnets 102 with different magnetic field intensities are selected, and output thresholds of the signal processing circuits in the Hall components 202 are changed, so that the magnetic field intensities that can be sensed by the Hall components 202 and the induction range under the selected magnets 102 are determined.

For example, when the magnet 102 enters the induction range of the Hall component 202, a low level is transmitted to the single-chip microcomputer 203. In this example, the Hall component 202 outputs a high level when the magnet 102 is not sensed, and outputs a low level when the magnet 102 is sensed. In such a manner, the induction information is transmitted to the single-chip microcomputer 203, and a specific output mode of the Hall component 202 may be set according to an actual requirement.

In an embodiment, the single-chip microcomputer 203 is further configured to, when receiving the induction information transmitted by the Hall component 202, determine the position information of the magnet 102 according to a transmission pin corresponding to the induction information and position information of the Hall component 202, and determine a rotation position of the knob mechanism 10, thereby generating switch gear information corresponding to the rotation position of the knob mechanism 10.

Specifically, the Hall components 202 are arranged on the PCB 20 in a dispersion mode, a switch gear number on the knob mechanism 10 corresponding to a position of each Hall component 202 on the PCB 20 may be preset, and then each Hall component 202 is numbered according to the transmission pin of the Hall component 202 connected to the single-chip microcomputer 203, to obtain a component number, and then a mapping relationship is formed among the transmission pins, the component number and the switch gear number is pre-stored in the single-chip computer. For example, when receiving the induction information transmitted by the Hall component 202, the single-chip microcomputer 203 determines the component number of the Hall component 202 transmitting the induction information according to the transmission pin receiving the induction information, determines the position information of the Hall component 202 through the preset mapping relationship, obtains the rotation position of the knob mechanism 10 through the transmission pin and the position information, and further obtains the switch gear number according to the rotation position and the mapping relationship to generate the switch gear information.

Further, an angle by which the knob mechanism 10 is rotated may be calculated according to position information of the knob mechanism 10 before and after the rotation, so that a rotation direction may be determined, and other functions may be preset according to different rotation directions, for example, different operating modes may be switched.

In the embodiment, the induction information transmitted by the Hall component 202 is utilized to determine the position information of the magnet 102 to generate the switch gear information, and accordingly a control accuracy, an automation degree, and a fault diagnosis capability of the CNC switch device can be improved, thereby improving the operating efficiency and reliability of the CNC switch device.

In an embodiment, the CNC switch device may further include a display component. The display component is configured to display current switch gear information. The display component can improve user experience, improve security and visualization of the CNC switch device, and facilitate maintenance and management of the CNC switch device.

Figure 3:
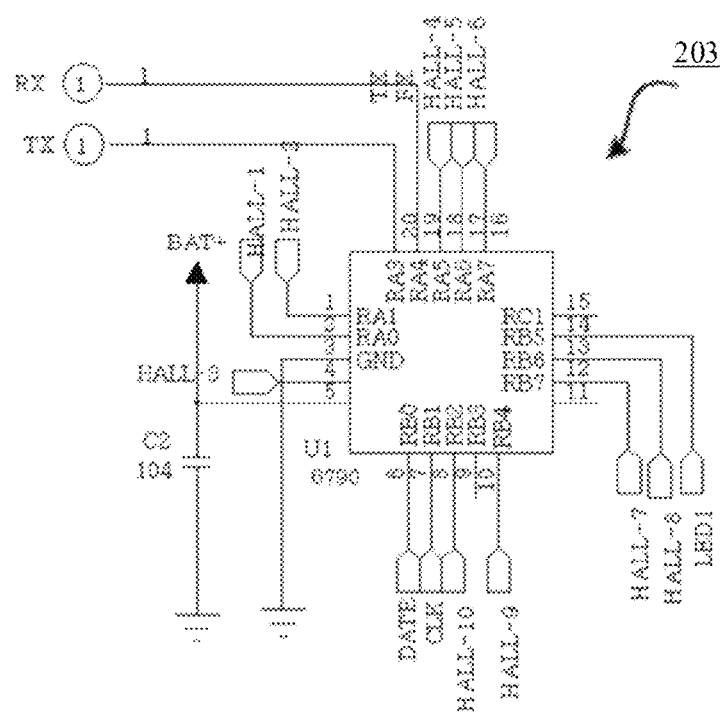
FIG. 3 is a schematic structure diagram of a single-chip microcomputer according to an embodiment.

In an embodiment, as shown in FIG. 3, the display component may include an LED component LED1 configured to display a digital gear. The LED component LED1 is configured to display the digital gear, which has advantages such as clear visibility, lower energy consumption, higher reliability, higher brightness, and long service life, and is adapted to display the current switch gear information.

In another embodiment, the LED component LED1 is configured to remain continuously illuminated when the control component receives the induction information, to indicate that the knob mechanism 10 is currently in one gear.

In an embodiment, the CNC switch device may further include a voltage regulation circuit (not shown). The control component is configured to generate, based on the induction information, a voltage regulation signal corresponding to the rotation position of the knob mechanism 10, and output the voltage regulation signal to the voltage regulation circuit. The voltage regulation circuit is configured to regulate an output voltage according to the voltage regulation signal, to regulate a switch gear of the CNC switch.

The voltage regulation signal may generate a specific voltage control signal according to a preset corresponding relationship between a rotation position and an output voltage. For example, the rotation position 1 corresponds to the voltage regulation signal 1, and the voltage regulation signal 1 corresponds to the output voltage 1 in the voltage regulation circuit. The voltage regulation signal may be in a form of a digital signal, an analog signal, a pulse width modulation (PWM) signal, or the like. The voltage regulation circuit may be a silicon-controlled rectifier voltage regulation circuit. The voltage regulation circuit regulates the output voltage according to the voltage regulation signal, and can accurately control the output voltage, in order to precisely regulate the switch gear of the CNC switch.

In another embodiment, a combination of a driver circuit and an execution unit may be adopted to regulate the switch gear. The driver circuit is configured to generate a drive signal according to an actuated signal and transmit the drive signal to the execution unit. The execution unit is configured to perform an action according to the drive signal to regulate the switch gear.

Figure 2:
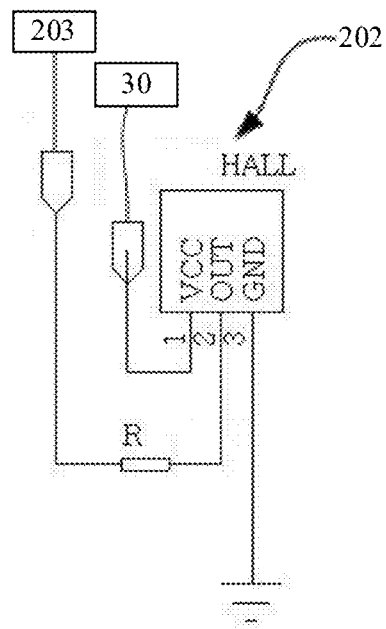
FIG. 2 is a schematic structure diagram of a Hall component according to an embodiment.

In an embodiment, as shown in FIG. 2, a first pin (VCC) of each Hall component 202 (HALL) is connected to a power supply 30, a second pin (OUT) of each Hall component 202 is connected to the single-chip microcomputer 203 through a resistor, and a third pin (GND) of each Hall component 202 is grounded. The first pin of each Hall component 202 is connected to the power supply 30, and the third pin is grounded, which contribute to reducing electromagnetic interference during the operation of the Hall component 202. By connecting the second pin to the single-chip microcomputer 203 through the resistor, the magnitude of the current flowing through the Hall component 202 may be limited, and the Hall component 202 is protected from an excessive current impact, thereby increasing the service life of the Hall component 202.

In an embodiment, as shown in FIG. 1, there exists ten Hall components 202. The second pin of each Hall component 202 is electrically connected to a preset pin on the single-chip microcomputer 203 respectively. The first pin of each Hall component 202 is connected to the same power supply 30. By electrically connecting the second pin of each Hall component 202 to the preset pin on the single-chip microcomputer 203, information transmitted by the different Hall components 202 may be correspondingly obtained through the different connection pins. The first pin of each Hall component 202 is connected to the same power supply 30, so that the power supply 30 can be managed in a unified mode, and wiring of the Hall components 202 on the PCB 20 can be simplified, thereby improving the reliability of the CNC switch device.

A specific pin connection arrangement of the single-chip microcomputer 203 may be as shown in FIG. 3. HALL-1 to HALL-10 correspond to ten Hall components 202 respectively, and the pin 2 of each Hall component 202 is electrically connected to one of pins 1, 2, 3, 8, 10, 12, 13, 16, 17, and 18 of the single-chip microcomputer 203. The pin 4 is configured to be grounded. The pin 5 is configured to be connected to a voltage-regulated power supply. The pin 6 (DATE) is configured to provide a programming connection. The pin 7 (CLK) is configured to be connected to a clock signal. The pin 14 (LED1) is configured to be connected to the display component. The pin 19 (RX) and pin 20 (TX) are configured to input and output serial port communication data.

Figure 4:
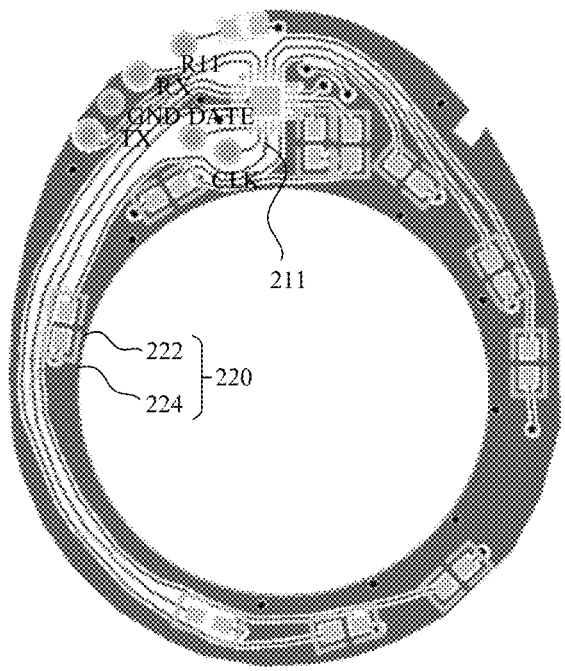
FIG. 4 is a schematic diagram illustrating a component layout on one side of a PCB according to an embodiment.
Figure 5:
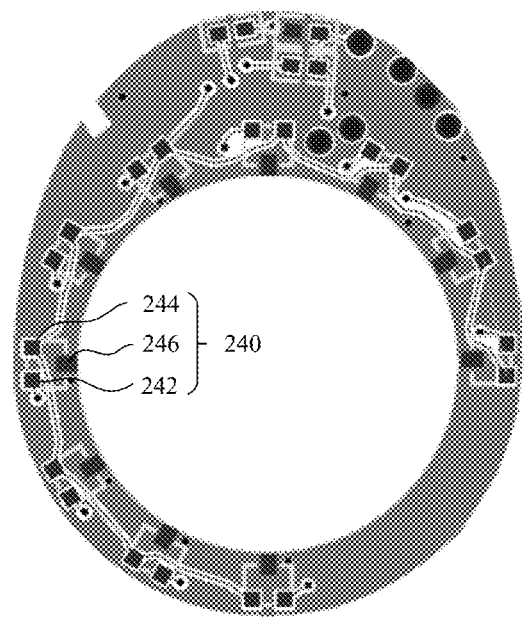
FIG. 5 is a schematic diagram illustrating a component layout on the other side of the PCB according to an embodiment.

FIG. 4 shows a component layout on one side of the PCB 20. FIG. 5 shows a component layout on the other side of the PCB 20. A pad group 211 is configured to be welded to the single-chip microcomputer 203, so that the single-chip microcomputer 203 is connected to a line in the PCB. The pad group 220 is configured to be welded to a resistor. One end of the resistor is connected to a pad 222, and the other end of the resistor is connected to a pad 224. The pad group 240 is configured to be welded to the Hall assembly 202. The pad 242 is connected to the pad 224 through a via hole, and the pad 242 is configured to be welded to the second pin of the Hall assembly 202. The pad 244 is connected to a power supply line on the PCB 20, and is configured to be welded to the first pin of the Hall assembly 202. The pad 246 is grounded by a line on the PCB 20, and is configured to be welded to a third pin of the Hall assembly 202.

In an embodiment, with reference to FIG. 1 and FIG. 5, distribution positions of the Hall components 202 on the PCB 20 match a rotation trajectory of the magnet 102. By arranging the Hall components 202 at positions matching the rotation trajectory of the magnet 102, the precise induction of the magnetic field of the magnet 102 at a specific position can be implemented, thereby accurately acquiring a position and a movement state of the magnet 102. For example, the Hall components may be arranged at equal intervals, so that the gear switch correspondingly set can make the switching between gears smoother.

In another embodiment, the single-chip microcomputer 203 receives the induction information of each Hall component 202, and may obtain a specific rotation trajectory and direction of the knob mechanism 10 according to a time stamp of each received induction information. Trigger time of each piece of induction information is different, and pieces of induction information may be sorted according to the trigger time. Accordingly, the position information corresponding to the Hall component 202 is obtained, and further the rotation trajectory of the magnet 102 is obtained.

In another embodiment, when a duration in which the single-chip microcomputer 203 acquires the currently received induction information is greater than a preset duration threshold, the switch gear of the CNC switch is regulated. In the CNC switch device, the knob mechanism 10 may pass through a plurality of gears when rotating. None of the gears which the knob mechanism 10 passes through is the final target gear. Accordingly, only information corresponding to the final target gear needs to be acquired according to the preset duration threshold and the gear switching is performed, which can reduce invalid operation actions of the CNC switch device, improve the service life, prevent a misoperation of switching to a gear which the knob mechanism 10 passes through, and improve the operation security.

Figure 6:
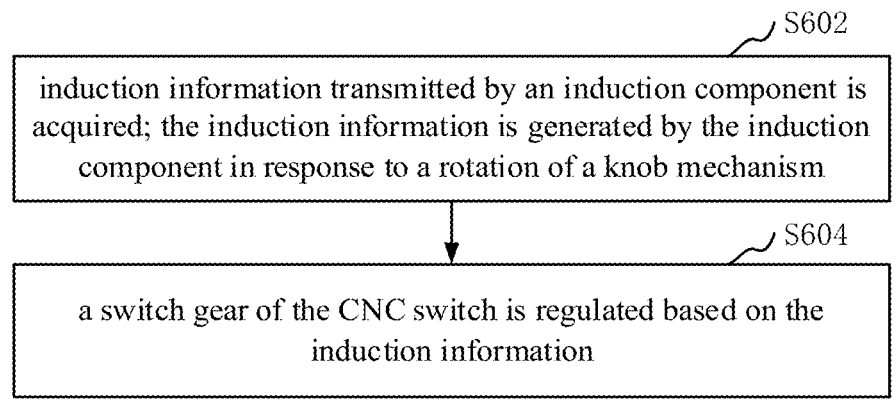
FIG. 6 is a flow chart showing a CNC switch control method according to an embodiment.

In another embodiment, as shown in FIG. 6, a CNC switch control method is provided, and is executed based on the above-mentioned CNC switch device. The CNC switch control method may include following steps S602 to S604.

Step S602: induction information transmitted by an induction component is acquired; the induction information is generated by the induction component in response to a rotation of a knob mechanism.

Step S604: a switch gear of the CNC switch is regulated based on the induction information.

In the above-mentioned CNC switch control method, the induction information of the induction component is acquired to regulate the switch gear of the CNC switch. Compared to a conventional metal elastic sheet switch, in the method, there is no need to use the metal elastic sheet to control the switch gear, so that the switch wear can be reduced, and the service life can be increased.

In an embodiment, a computer-readable storage medium is provided, on which a computer program is stored. The computer program, when executed by a processor, may cause the processor to implement the steps of the above-mentioned CNC switch control method.

A person of ordinary skill in the art may understand that all or a part of the processes in the methods in the aforementioned embodiments may be implemented by a computer program instructing related hardware. The computer program may be stored in a non-transitory computer-readable storage medium. When the computer program is executed, the processes in the aforementioned method embodiments may be included. Any reference to a memory, a storage, a database, or another medium used in the embodiments provided in the present disclosure may include at least one of a non-transitory memory or a transitory memory. The non-transitory memory may include a Read-Only Memory (ROM), a magnetic tape, a floppy disk, a flash memory, an optical memory, or the like. The transitory memory may include a Random Access Memory (RAM) or an external cache memory. As an illustration rather than a limit, the RAM may be in multiple forms, such as a Static Random Access Memory (SRAM) or a Dynamic Random Access Memory (DRAM).

The technical features in the aforementioned embodiments may be combined in any manner. In order to make the description brief, all possible combinations of the technical features in the aforementioned embodiments are not described. However, as long as there is no contradiction among the combinations of the technical features, these combinations should be considered as the scope of the present disclosure.

The aforementioned embodiments represent only some implementation modes of the present disclosure, and the description thereof is relatively specific and detailed, but may not be construed as a limit on the scope of the present disclosure. It should be noted that a person of ordinary skill in the art may make some modifications and improvements without departing from the concept of the present disclosure, which all fall with the protection scope of the present disclosure. Therefore, the protection scope of the present disclosure shall be subject to the appended claims.

What is claimed is:

1. A Computer Numerical Control (CNC) switch device, comprising a knob mechanism and a Printed Circuit Board (PCB), wherein
the knob mechanism is provided with a magnet, and the PCB is provided with an induction component, a control component, and a plurality of vices, the control component is electrically connected to the indication component, the knob mechanism is notably connected to the PCB;
when the knob mechanism rotates with respect to the PCB in a contactless mode, the magnet is configured to rotate with the knob mechanism, the induction component on the PCB is configured to sense position information of the magnet and transmit the sensed position information to the control component, and the control component is configured to regulate a switch gear of the CNC switch based on the position information;
wherein the induction component comprises a plurality of Hall components, and the control component comprises a single-chip microcompiler, wherein the plurality of Hall components are arranged on the PCB in a dispersion mode and each configured to generate induction information and transmit the induction information to the single-chip microcomputer when the magnet enters an induction range of the Hall component;
wherein the single-chip microcomputer is further configured to receive the induction information transmitted by each Hall component, determine position information of the magnet according to a transmission pin corresponding to the induction information and position information of the Hall component, and determine a rotation position of the knob mechanism, to generate switch gear information corresponding to the rotation position of the knob mechanism;
wherein the plurality of wires are configured to perform electrical conditions among the knob mechanism, the magnet, the PCB, and the plurality of Hall components.

2. The CNC switch device according to claim 1, further comprising a display component, wherein the display component is configured to display current switch gear information;
wherein the display component comprises an LED component, and the LED component is configured to display a digital gear.

3. The CNC switch device according to claim 1, wherein a first pin of each Hall component is configured to be connected to a power supply, a second pin of each Hall component is configured to be connected to the single-chip microcomputer through a resistor, and a third pin of each Hall component is configured to be grounded.

4. The CNC switch device according to claim 3, wherein there exists ten Hall components, the second pin of each Hall component is configured to be electrically connected to a preset pin on the single-chip microcomputer, and the first pin of each Hall component is configured to be connected to the same power supply.

5. The CNC switch device according to claim 4, wherein distribution positions of the Hall components on the PCB match a rotation trajectory of the magnet.

6. The CNC switch device according to claim 1, wherein a Hall component is a Hall effect sensor integrated circuit (IC) configured to detect a magnetic field based on a Hall effect.

7. The CNC switch device according to claim 2, wherein the LED component is configured to remain continuously illuminated when the control component receives the induction information, to indicate that the knob mechanism is currently in one gear.

8. The CNC switch device according to claim 5, wherein the single-chip microcomputer is configured to receive the induction information of each Hall component, and obtain the rotation trajectory and a rotation direction of the knob mechanism according to a time stamp of each received induction information.

9. The CNC switch device according to claim 7, wherein the switch gear of the CNC switch is regulated when a duration in which the single-chip microcomputer acquires the currently received induction information is greater than a preset duration threshold.

10. A CNC switch control method, applied to the control component in the CNC switch device of claim 1, the method comprising:
acquiring induction information transmitted by the induction component, wherein the induction information is generated by the induction component in response to a rotation of the knob mechanism;
receiving the induction information transmitted by each Hall component, determining position information of the magnet according to a transmission pin corresponding to the induction information and position information of the Hall component, and determining a rotation position of the knob mechanism, to generate switch gear information corresponding to the rotation position of the knob mechanism; and
regulating a switch gear of the CNC switch based on the switch gear information.

* * * * *